(12) United States Patent
Fukui et al.

(10) Patent No.: US 10,270,050 B2
(45) Date of Patent: Apr. 23, 2019

(54) PHOTOELECTRIC CONVERSION LAYER COMPOSITION AND PHOTOELECTRIC CONVERSION ELEMENT

(71) Applicant: DAICEL CORPORATION, Osaka-shi, Osaka (JP)

(72) Inventors: Kazuhisa Fukui, Himeji (JP); Mami Sakurai, Himeji (JP)

(73) Assignee: DAICEL CORPORATION, Osaka-Shi (JP)

( * ) Notice: Subject to any disclaimer, the term of this patent is extended or adjusted under 35 U.S.C. 154(b) by 451 days.

(21) Appl. No.: 14/413,871

(22) PCT Filed: Jul. 24, 2013

(86) PCT No.: PCT/JP2013/070037
§ 371 (c)(1),
(2) Date: Jan. 9, 2015

(87) PCT Pub. No.: WO2014/017535
PCT Pub. Date: Jan. 30, 2014

(65) Prior Publication Data
US 2015/0171355 A1    Jun. 18, 2015

(30) Foreign Application Priority Data
Jul. 27, 2012 (JP) ................. 2012-167204

(51) Int. Cl.
*C09B 57/10* (2006.01)
*H01L 51/44* (2006.01)
(Continued)

(52) U.S. Cl.
CPC ............ *H01L 51/441* (2013.01); *C09B 57/10* (2013.01); *H01G 9/2004* (2013.01);
(Continued)

(58) Field of Classification Search
CPC ...................... H01L 51/441; H01L 51/4206
See application file for complete search history.

(56) References Cited

U.S. PATENT DOCUMENTS

| 6,069,313 A | 5/2000 | Kay |
| 2005/0005963 A1 | 1/2005 | Fan |

(Continued)

FOREIGN PATENT DOCUMENTS

| CN | 101789317 A | 7/2010 |
| JP | 01-220380 A | 9/1989 |

(Continued)

OTHER PUBLICATIONS

Ikeda, JP 2005251426 A, English Machine Translation, Japan, pp. 1-9.*

(Continued)

*Primary Examiner* — Tae-Sik Kang
(74) *Attorney, Agent, or Firm* — Birch, Stewart, Kolasch, & Birch, LLP (57) ABSTRACT

A composition that can form a photoelectric conversion layer having an electricity storage function is provided. The composition comprises at least a semiconductor (e.g., a titanium oxide particle) and an ionic polymer (e.g., a fluorine-series resin having a sulfo group), and the ratio of the ionic polymer relative to 1 part by weight of the semiconductor is not less than 0.05 parts by weight. The composition may further contain a dye (a sensitizing dye). An electrode provided with a photoelectric conversion layer formed from the composition can be used in combination with, in particular, an electrode having a porous layer to give a photoelectric conversion element having an excellent electricity storage function.

13 Claims, 2 Drawing Sheets

(51) Int. Cl.
   *H01L 51/42* (2006.01)
   *H01G 9/20* (2006.01)
   *H01L 51/00* (2006.01)

(52) U.S. Cl.
   CPC ......... *H01G 9/2022* (2013.01); *H01G 9/2059* (2013.01); *H01L 51/4206* (2013.01); *H01L 51/4226* (2013.01); *H01G 9/2031* (2013.01); *H01L 51/0007* (2013.01); *H01L 51/0028* (2013.01); *Y02E 10/542* (2013.01); *Y02E 10/549* (2013.01); *Y02P 70/521* (2015.11)

(56) References Cited

U.S. PATENT DOCUMENTS

| | | | |
|---|---|---|---|
| 2006/0107994 A1 | 5/2006 | Morooka et al. | |
| 2007/0194311 A1 | 8/2007 | Kojima et al. | |
| 2009/0223559 A1* | 9/2009 | Kubo | H01G 9/2036 136/256 |
| 2012/0255604 A1* | 10/2012 | Kang | H01G 9/2004 136/256 |

FOREIGN PATENT DOCUMENTS

| | | |
|---|---|---|
| JP | 2664194 B2 | 10/1997 |
| JP | 2001-085077 A | 3/2001 |
| JP | 2004-214129 A | 7/2004 |
| JP | 2004-288985 A | 10/2004 |
| JP | 2005-135799 A | 5/2005 |
| JP | 2005-251426 A | 9/2005 |
| JP | 2005251426 A * | 9/2005 |
| JP | 4757433 B2 | 8/2011 |
| WO | WO 03/107471 A1 | 12/2003 |

OTHER PUBLICATIONS

Notification for the Opinion of Examination dated Jul. 12, 2016, in Taiwan Patent Application No. 102126803, with English translation.

Chinese Office Action and Chinese Search Report, dated Dec. 5, 2016, for Chinese Application No. 201380039997.5, with English translations.

Park et al., "TiO$_2$-Nafion Photoelectrode Hybridized with Carbon Nanotubes for Sensitized Photochemical Activity," J. Phys. Chem. C, vol. 113, No. 49, 2009 (Published on Web Nov. 12, 2009), pp. 20974-20979.

Extended European Search Report dated Sep. 24, 2015, in European Patent Application No. 13822534.7.

English translation of International Preliminary Report on Patentability and Written Opinion dated Feb. 5, 2015, in PCT International Application No. PCT/JP2013/070037.

International Search Report issued in PCT/JP2013/070037 dated Oct. 1, 2013.

* cited by examiner

PHOTOELECTRIC CONVERSION LAYER COMPOSITION AND PHOTOELECTRIC CONVERSION ELEMENT

TECHNICAL FIELD

The present invention relates to a composition useful for forming a photoelectric conversion layer constituting a photoelectric conversion element, e.g., a solar cell (in particular, a dye-sensitized solar cell), an electrode (photoelectrode) containing a composition, and a photoelectric conversion element provided with the electrode.

BACKGROUND ART

Solar cells are standing out as an eco-friendly clean energy and are in practical use. A solar cell containing a crystalline silicon is now being extensively used. A problem with this solar cell is high costs of power generation due to use of a highly pure silicon. Another problem is inefficiency in conversion of weak light (such as indoor weak light).

In order to solve these problems, a solar cell containing an organic material in a photoelectric conversion site is being widely developed. In particular, a dye-sensitized solar cell is attracting much attention. The dye-sensitized solar cell was developed by Graetzel et al. in Swiss Federal Institute of Technology in Lausanne [for example, Japanese Patent No. 2664194 (JP-2664194B, Patent Document 1)]. It is a great characteristic of the dye-sensitized solar cell to contain a metal-oxide-semiconductor (e.g., titanium oxide) and a sensitizing dye as a photoelectric conversion site.

Conventional solar cells share a problem in terms of stable supply of electric power. For example, each one of the solar cells generates electricity only under the exposure of the light and does not function as a cell during the night. In addition, the generating power (or output power) fluctuates depending on the intensity of the light. In order to solve these problems, the solar cell is sometimes used in combination with an electricity storage apparatus (a capacitor or a condenser).

The production of the dye-sensitized solar cell with the electricity storage function is also being attempted. For example, Japanese Patent No. 4757433 (JP-4757433B, Patent Document 2) discloses a rechargeable solar cell. The rechargeable solar cell has a first electrolyte solution, a second electrolyte solution, and a cation exchange membrane interposed between the first and second electrolyte solutions; the first electrolyte solution and the second electrolyte solution are cut off from an external air; the first electrolyte solution contains iodine and an iodine compound; the second electrolyte solution contains an iodine-free compound; the components of the first electrolyte solution are different from the components of the second electrolyte solution; there are a photoanode and a counter electrode in the first electrolyte solution; there is a charge storage electrode in the second electrolyte solution; and the photoanode and the charge storage electrode are separated from each other by the cation exchange membrane.

Unfortunately, the dye-sensitized solar cell described in this document requires two electrolytic solutions different in composition from each other in order to impart an electricity storage function and inevitably has a highly complicated structure due to a newly added electrode. Moreover, use of a polypyrrole or the like as the positive electrode increases the internal resistance and is thus a factor of decrease in the generating power of the dye-sensitized solar cell. In addition, since an electrode to be used for the generating power from the solar cell differs from an electrode to be used for the generating power (discharge) from the electric double layer capacitor, it is necessary to control the generating powers by an external circuit. Thus the solar cell has a complicated circuit structure.

Meanwhile, in a dye-sensitized solar cell, the photoelectric conversion occurs on an interface between a metal-oxide-semiconductor and a sensitizing dye. In order to increase the photoelectric conversion efficiency, it is desired to increase the surface area of the metal-oxide-semiconductor. Thus, for the dye-sensitized solar cell, an electrode composed of a nano-sized metal-oxide-semiconductor is used to increase the effective area compared with the apparent area.

In a case where the metal oxide nanoparticle is just applied on a substrate, the metal oxide nanoparticle easily peels (or separates) from the substrate due to a slight impact strength and thus fails to function as an electrode. Moreover, since the generated electricity cannot be drawn out efficiently due to a large electric resistance between the particles, the resulting cell has a low conversion efficiency. These problems are solved by applying (or coating) a titanium oxide nanoparticle on a substrate and then heat-treating the coated substrate at a high temperature (about 450° C.) to melt-bond the titanium oxide particles.

Unfortunately, this method, which requires the exposure of the substrate to a high temperature, restricts the substantially practicable substrate to an inorganic material (e.g., a glass). Thus this method cannot produce a flexible dye-sensitized solar cell containing a plastic substrate.

Moreover, since the dye is thermally decomposed in the sintering (heat-treating) step, the dye cannot be adsorbed on the metal-oxide-semiconductor before the application (or coating). Thus a dye-adsorbing step is necessary after the sintering step. On the whole, this method requires complicated processes, including the sintering step, which is one of factors increasing the production cost.

Japanese Patent Application Laid-Open Publication No. 2005-251426 (JP-2005-251426A, Patent Document 3) discloses a method for measuring an amount of a dye, the method comprising the steps of: fixing a metal oxide, a metal sulfide, a metal nitride, a metal cluster, or an alloy thereof on a conductive substrate so that a dye can be coupled detachably on the substrate; coupling a dye to the substrate; irradiating a light with the resulting substrate to generate a current; measuring the amount of the current; and determining the amount of the coupled dye from the amount of the current. This document discloses that the method for fixing the metal compound so as to allow the isolation of the dye preferably includes use of a polymer electrolyte and that, in Examples, Nafion® (manufactured by Aldrich, trade name "Nafion 117", average molecular weight: 1000) was suspended in 1 ml of ethanol, 400 ml of a 20.5% aqueous solution of titanium oxide fine particle (manufactured by TAYCA Corporation, trade name "TKS-203", particle diameter: about 6 nm) was uniformly dispersed in the suspension, and the resulting titanium oxide-Nafion sol dispersion was used to produce an ITO electrode modified with titanium oxide.

RELATED ART DOCUMENTS

Patent Documents

Patent Document 1: JP-2664194B (Claims)
Patent Document 2: JP-4757433B (Claims, Examples)

Patent Document 3: JP-2005-251426A (Claims, paragraphs [0011] to [0012], Examples)

SUMMARY OF THE INVENTION

Problems to be Solved by the Invention

It is therefore an object of the present invention to provide a composition that can form a photoelectrically convertible layer having an electricity storage function, an electrode (laminate) having a photoelectric conversion layer formed from the composition, a process for producing the electrode (laminate), and a photoelectric conversion element provided with the electrode.

Another object of the present invention is to provide a composition that can form a photoelectric conversion layer having an excellent photoelectric conversion characteristic without a sintering step, a laminate (electrode) having a photoelectric conversion layer formed from the composition, a process for producing the laminate (electrode), and a photoelectric conversion element provided with the laminate.

Means to Solve the Problems

The inventors of the present invention made intensive studies to achieve the above objects and finally found that (i) use of a relatively large amount of an ionic polymer (e.g., a strongly acidic ion exchange resin) to a semiconductor (e.g., a titanium oxide particle) or selective combination of a semiconductor and an ionic polymer (e.g., combination of an n-type semiconductor and an anionic polymer) for a photoelectric conversion layer surprisingly allows a photoelectric conversion element (e.g., a solar cell) having a photoelectric conversion function and an electricity storage function which conflict and are incompatible with each other and (ii) a photoelectric conversion layer having an excellent photoelectric conversion characteristic can be formed without a sintering step. The present invention was accomplished based on the above findings.

That is, an aspect of the present invention provides a composition (a photoelectric conversion layer composition or a photoelectrically convertible composition) which forms a photoelectric conversion layer, and the composition contains a semiconductor and an ionic polymer. The photoelectric conversion layer formed from the composition may usually have an electricity storage function. In the composition, the ratio of the ionic polymer may usually be not less than 0.05 parts by weight (for example, about 0.05 to 100 parts by weight and preferably about 0.1 to 10 parts by weight) relative to 1 part by weight of the semiconductor.

In the composition, the semiconductor may comprise a metal oxide (for example, titanium oxide). The semiconductor may be nano-sized. The semiconductor may be in the form of a particle (or in a particulate form). A preferred semiconductor includes a titanium oxide nanoparticle.

In the composition, a combination of the semiconductor and the ionic polymer may representatively include (i) a combination of an n-type semiconductor and an ionic polymer containing an anionic polymer, or (ii) a combination of a p-type semiconductor and an ionic polymer containing a cationic polymer. Such a selective combination of the semiconductor and the ionic polymer (further, use of a relatively large amount of the ionic polymer to the semiconductor) can efficiently give a photoelectric conversion layer having an electricity storage function.

In particular, the combination of the semiconductor and the ionic polymer may be the combination (i). In such a combination, as the n-type semiconductor, for example, a semiconductor (an n-type semiconductor) containing a titanium oxide particle may preferably be used.

In the combination (i), the anionic polymer may contain, for example, a strongly acidic ion exchange resin. The anionic polymer may have a pH value of less than 7 at 25° C.

The composition may representatively include a composition in which the semiconductor comprises a titanium oxide nanoparticle, the ionic polymer comprises an ionic polymer containing a fluorine-containing resin with a sulfo group and having a pH value of not more than 3 and the ratio of the ionic polymer is 0.2 to 1 part by weight relative to 1 part by weight of the semiconductor.

The composition may further contain a dye (for example, a ruthenium complex dye).

Another aspect of the present invention provides a laminate (electrode) comprising a conductive substrate (or an electrically conductive substrate) and a photoelectric conversion layer (a photoelectrically convertible layer laminated on or over the substrate), and the photoelectric conversion layer comprises (or is formed from) the composition. The conductive substrate may be, for example, a plastic substrate having an electric conductor layer (or a conductive layer). In such a laminate, the photoelectric conversion layer may have a thickness of, for example, about 0.1 to 100 µm.

A further aspect of the present invention provides a process for producing the laminate, and the process comprises coating a conductive substrate (or an electrically conductive substrate) with the composition. In such a process, usually, the laminate may be produced without sintering (or without passing through sintering) a semiconductor (or the composition) after the coating.

Another aspect of the present invention provides a photoelectric conversion element (or a photoelectrically convertible device) provided with the laminate (electrode). The photoelectric conversion element may usually be provided with a counter electrode. A representative photoelectric conversion element may include a solar cell provided with the laminate as an electrode. For example, the dye-sensitized solar cell may be provided with: a laminate comprising a photoelectric conversion layer, as an electrode, containing a dye; an electrolyte layer; and a counter electrode; in which the electrolyte layer is sealed between these electrodes. In such a photoelectric conversion element (or dye-sensitized solar cell), in particular, the counter electrode may be a counter electrode (an electrode) having a porous layer (particularly, a porous catalyst layer).

According to an aspect of the present invention, the composition may be used as a composition for forming a photoelectric conversion layer having an electricity storage function, as described above. Thus, an aspect of the present invention provides a method for imparting an electricity storage function to a photoelectric conversion layer. The method may include a method for imparting an electricity storage function to a photoelectric conversion layer (a photoelectric conversion layer containing a semiconductor) (or a method for producing a photoelectric conversion layer having an electricity storage function, or a method for increasing or improving an electricity storage function of a photoelectric conversion layer) with an ionic polymer; the method comprises mixing an ionic polymer with a semiconductor to form a photoelectric conversion layer. In the method, an embodiment (including a preferred embodiment), such as a species or a ratio, of the semiconductor and the ionic polymer may be similar to that of the composition. For example, in the method, the ratio of the ionic polymer may be the same as described above [specifically, not less than 0.05 parts by weight (e.g., 0.05 to 100 parts by weight) relative to 1 part by weight of the semiconductor].

Effects of the Invention

According to the present invention, a composition allows the formation of a photoelectric conversion layer having an electricity storage function. Moreover, the composition allows the formation of a photoelectric conversion layer having an excellent photoelectric conversion characteristic without a sintering step. Thus, according to the present invention, since there is no need to expose a substrate to a high temperature, a plastic substrate is advantageously usable as the substrate. The plastic substrate makes it possible to produce a flexible electrode or photoelectric conversion element. Further, a production process of a photoelectric conversion layer can be simplified due to no sintering step. In particular, in the forming step of a dye-sensitized photoelectric conversion layer, since a dye can be attached to or adsorbed on a semiconductor in advance, it is of great advantage to simplify the production process.

DESCRIPTION OF EMBODIMENTS

[Photoelectric Conversion Layer Composition]

The composition of the present invention at least contains a semiconductor and an ionic polymer. The composition is particularly useful as a composition for forming a photoelectric conversion layer constituting an electrode, as will be described below.

(Semiconductor)

The semiconductor is classified broadly into two groups of inorganic and organic semiconductors. According to the present invention, the inorganic semiconductor may preferably be used. The inorganic semiconductor may suitably be selected according to purposes as far as an inorganic matter has a semiconductor characteristic. For example, the inorganic semiconductor may include a metal as a simple substance, and a metal compound (e.g., a metal oxide, a metal sulfide, and a metal nitride).

The metal constituting the inorganic semiconductor may include, for example, a group 2 metal of the Periodic Table (e.g., calcium and strontium), a group 3 metal of the Periodic Table (e.g., scandium, yttrium, and a lanthanoid), a group 4 metal of the Periodic Table (e.g., titanium, zirconium, and hafnium), a group 5 metal of the Periodic Table (e.g., vanadium, niobium, and tantalum), a group 6 metal of the Periodic Table (e.g., chromium, molybdenum, and tungsten), a group 7 metal of the Periodic Table (e.g., manganese), a group 8 metal of the Periodic Table (e.g., iron), a group 9 metal of the Periodic Table (e.g., cobalt), a group 10 metal of the Periodic Table (e.g., nickel), a group 11 metal of the Periodic Table (e.g., copper), a group 12 metal of the Periodic Table (e.g., zinc and cadmium), a group 13 metal of the Periodic Table (e.g., aluminum, gallium, indium, and thallium), a group 14 metal of the Periodic Table (e.g., germanium and tin), a group 15 metal of the Periodic Table (e.g., arsenic, antimony, and bismuth), and a group 16 metal of the Periodic Table (e.g., tellurium).

The semiconductor may be a compound having such a metal alone or a compound having a plurality of these metals. For example, the semiconductor may be an alloy. The metal oxide may be a complex oxide (or a compound oxide). The semiconductor may contain the above-mentioned metal and another metal (e.g., an alkali metal) in combination.

Concrete semiconductors may include, for example, a metal compound (or alloy) and a metal as a simple substance. As the metal compound (or alloy), there may be mentioned, for example, a metal oxide, a metal nitride (e.g., thallium nitride), a metal phosphide (e.g., InP), a metal sulfide {for example, CdS, copper sulfide (CuS, $Cu_2S$), a complex sulfide [e.g., a complex sulfide of a group 11 metal of the Periodic Table and a representative metal (e.g., a complex sulfide of copper and a group 13 metal of the Periodic Table, such as $CuGaS_2$ or $CuInS_2$)}, a metal selenide (e.g., CdSe and ZnSe), a metal halide (e.g., CuCl and CuBr), a compound of a group 13 metal and a group 15 metal of the Periodic Table (e.g., GaAs and InSb), and a compound of a group 12 metal and a group 16 metal of the Periodic Table (e.g., CdTe). The metal as a simple substance may include, for example, palladium, platinum, silver, gold, silicon, and germanium. As the metal oxide, there may be mentioned, for example, an oxide of a transition metal, an oxide of a representative metal, a complex oxide containing a plurality of these metals, and an oxide containing a plurality of these metals and a group 16 element of the Periodic Table other than oxygen. The oxide of a transition metal may include, for example, an oxide of a group 3 metal of the Periodic Table (such as yttrium oxide or cerium oxide), an oxide of a group 4 metal of the Periodic Table (such as titanium oxide (titanium dioxide), zirconium oxide, calcium titanate, or strontium titanate), a oxide of a group 5 metal of the Periodic Table (such as vanadium oxide, niobium oxide, or tantalum oxide (e.g., ditantalum pentoxide)), an oxide of a group 6 metal of the Periodic Table (such as chromium oxide or tungsten oxide), an oxide of a group 7 metal of the Periodic Table (such as manganese oxide), an oxide of a group 8 metal of the Periodic Table (such as iron oxide or ruthenium oxide), an oxide of a group 9 metal of the Periodic Table (such as cobalt oxide, iridium oxide, or a complex oxide of cobalt and sodium), an oxide of a group 10 metal of the Periodic Table (such as nickel oxide), an oxide of a group 11 metal of the Periodic Table (such as copper oxide), and an oxide of a group 12 metal of the Periodic Table (such as zinc oxide). The oxide of a representative metal may include, for example, an oxide of a group 2 metal of the Periodic Table (such as strontium oxide), an oxide of a group 13 metal of the Periodic Table (such as gallium oxide or indium oxide), an oxide of a group 14 metal of the Periodic Table (such as silicon oxide or tin oxide), and an oxide of a group 15 metal of the Periodic Table (such as bismuth oxide). The complex oxide containing a plurality of these metals may include, for example, a complex oxide of a group 11 metal of the Periodic Table and a transition metal (a transition metal other than a group 11 metal of the Periodic Table) (e.g., a complex oxide of copper and a group 3 metal of the Periodic Table, such as $CuYO_2$) and a complex oxide of a group 11 metal of the Periodic Table and a representative metal (e.g., a complex oxide of copper and a group 13 metal of the Periodic Table, such as $CuAlO_2$, $CuGaO_2$, or $CuInO_2$; a complex oxide of copper and a group 2 metal of the Periodic Table, such as $SrCu_2O_2$;

and a complex oxide of silver and a group 13 metal of the Periodic Table, such as AgInO$_2$). The oxide containing a plurality of these metals and a group 16 element of the Periodic Table other than oxygen may include, for example, a complex oxysulfide of a group 11 metal of the Periodic Table and a transition metal (a transition metal other than a group 11 metal of the Periodic Table) (e.g., a complex oxysulfide of copper and a group 3 metal of the Periodic Table, such as LaCuOS) and a complex oxyselenide of a group 11 metal of the Periodic Table and a transition metal (a transition metal other than a group 11 metal of the Periodic Table) (e.g., a complex oxyselenide of copper and a group 3 metal of the Periodic Table, such as LaCuOSe).

The semiconductor may be a semiconductor doped with other elements.

The semiconductor may be an n-type semiconductor or a p-type semiconductor. According to the present invention, in particular, the n-type semiconductor and the p-type semiconductor may preferably be used in combination with an anionic polymer and a cationic polymer, respectively, among after-mentioned ionic polymers. Such a combination allows the efficient formation of a photoelectric conversion layer having an electricity storage function.

Among these semiconductors exemplified above (in particular, inorganic semiconductors), the representative examples of the n-type semiconductor may include an oxide of a group 4 metal of the Periodic Table (e.g., titanium oxide), an oxide of a group 5 metal of the Periodic Table (e.g., niobium oxide and tantalum oxide), an oxide of a group 12 metal of the Periodic Table (e.g., zinc oxide), an oxide of a group 13 metal of the Periodic Table (e.g., gallium oxide and indium oxide), and an oxide of a group 14 metal of the Periodic Table (e.g., tin oxide).

The representative examples of the p-type semiconductor may include an oxide of a group 6 metal of the Periodic Table (e.g., chromium oxide), an oxide of a group 7 metal of the Periodic Table (e.g., manganese oxide), an oxide of a group 8 metal of the Periodic Table (e.g., iron oxide), an oxide of a group 9 metal of the Periodic Table (e.g., cobalt oxide and iridium oxide), an oxide of a group 10 metal of the Periodic Table (e.g., nickel oxide), an oxide of a group 11 metal of the Periodic Table (e.g., copper oxide), an oxide of a group 15 metal of the Periodic Table (e.g., bismuth oxide), a complex oxide of a group 11 metal of the Periodic Table and a transition or representative metal (e.g., CuYO$_2$, CuAlO$_2$, CuGaO$_2$, CuInO$_2$, SrCu$_2$O$_2$, and AgInO$_2$), a complex oxysulfide of a group 11 metal of the Periodic Table and a transition metal (e.g., LaCuOS), a complex oxyselenide of a group 11 metal of the Periodic Table and a transition metal (e.g., LaCuOSe), and a complex sulfide of a group 11 metal of the Periodic Table and a representative metal (e.g., CuGaS$_2$ and CuInS$_2$).

These semiconductors may be used alone or in combination.

Among them, a preferred semiconductor may include a metal oxide, in particular, a transparent metal oxide (a metal oxide having a transparency). Such a metal oxide may include titanium oxide (including titanium dioxide (TiO$_2$)), zinc oxide (ZnO), tin oxide (including stannic oxide (SnO$_2$)), indium oxide (including indic oxide (In$_2$O$_3$)), gallium oxide (including gallic oxide (Ga$_2$O$_3$)), copper-aluminum oxide (including CuAlO$_2$), iridium oxide (including iridium monoxide (IrO)), nickel oxide (including nickel monoxide (NiO)), a doped form of each of these metal oxides, and others.

Among these semiconductors, the n-type semiconductor may preferably be used in view of electric conduction or others. In particular, according to the present invention, an n-type metal-oxide-semiconductor, such as titanium oxide (TiO$_2$), may preferably be used.

The titanium oxide may have any crystal form of a rutile form, an anatase form, or a brookite form. According to the present invention, rutile or anatase titanium oxide may preferably be used. In particular, anatase titanium oxide is preferred. Rutile titanium oxide, which is easily oriented and has a relatively large contact area between titanium oxides, may preferably be used in the light of conductivity or durability.

The form or configuration of the semiconductor (for example, a metal oxide such as titanium oxide) may include, but should not be limited to, a particulate form, a fibrous form (or a needle-like form or a rod-like form), and a plate-like form. A preferred form may include a particulate or needle-like form. In particular, a particulate semiconductor (semiconductor particle) is preferred.

The semiconductor particle may have an average particle diameter (an average primary particle diameter) selected from the range of about 1 to 1000 nm (for example, about 1 to 700 nm), usually, an average particle diameter of a nano-size (nanometer size), for example, 1 to 500 nm (e.g., 2 to 400 nm), preferably 3 to 300 nm (e.g., 4 to 200 nm), more preferably 5 to 100 nm (e.g., 6 to 70 nm), and particularly not more than 50 nm [for example, 1 to 50 nm (e.g., 2 to 40 nm), preferably 3 to 30 nm (e.g., 4 to 25 nm), more preferably 5 to 20 nm (e.g., 6 to 15 nm), and usually 10 to 50 nm].

The needle-like (or fibrous) semiconductor may have an average fiber diameter of, for example, about 1 to 300 nm, preferably about 10 to 200 nm, and more preferably about 50 to 100 nm. Moreover, the needle-like semiconductor may have an average fiber length of about 10 to 2000 nm, preferably about 50 to 1000 nm, and more preferably about 100 to 500 nm. The needle-like semiconductor may have an aspect ratio of, for example, about 2 to 200, preferably about 5 to 100, and more preferably about 20 to 40.

The semiconductor (for example, a fibrous or particulate semiconductor) may have a specific surface area of, for example, about 1 to 600 m$^2$/g, preferably about 2 to 500 m$^2$/g, and more preferably about 3 to 400 m$^2$/g, depending on the form thereof or others.

In particular, the semiconductor particle may have a specific surface area of, for example, 5 to 600 m$^2$/g (e.g., 7 to 550 m$^2$/g), preferably 10 to 500 m$^2$/g (e.g., 15 to 450 m$^2$/g), more preferably 20 to 400 m$^2$/g (e.g., 30 to 350 m$^2$/g), and particularly not less than 50 m$^2$/g [for example, 50 to 500 m$^2$/g, preferably 70 to 450 m$^2$/g, more preferably 100 to 400 m$^2$/g, and particularly 150 to 350 m$^2$/g (e.g., 200 to 350 m$^2$/g)].

The fibrous or needle-like semiconductor may have a specific surface area of about 1 to 100 m$^2$/g, preferably about 2 to 70 m$^2$/g, and more preferably about 3 to 50 m$^2$/g (e.g., about 4 to 30 m$^2$/g).

The semiconductor (e.g., titanium oxide) may be in the form of a dispersion (e.g., a water dispersion), and the dispersion may be mixed with an ionic polymer (and the after-mentioned dye). Moreover, as the semiconductor, a commercially available product may be used, or a product synthesized by a conventional method may be used. For example, a titanium oxide dispersion is obtainable by the method described in Japanese Patent No. 4522886 or others.

(Ionic Polymer)

The present invention is characterized by combination (compounding) of a semiconductor and an ionic polymer. Such a combination allows the formation of a photoelectric conversion layer having both a photoelectric conversion function and an electricity storage function (a photoelectric conversion layer having a function as what is called an electric double layer or a capacitor). Moreover, probably because the ionic polymer serves as a binder, a photoelectric conversion layer having an excellent photoelectric conversion characteristic can be formed without sintering the semiconductor (such as a titanium oxide nanoparticle). This reason is not known exactly, but possible reasons include as follows: the combination of the ionic polymer and the semiconductor [in particular, a nano-sized semiconductor particle (a semiconductor nanoparticle)] in prescribed amount improves the dispersion stability of the semiconductor and effectively shows semiconductor characteristics; depending on the species of the ionic polymer, the ionic polymer itself also functions as an electrolyte (solid electrolyte) that transports the charge generated by photoelectric conversion.

It is sufficient that the ionic polymer (ionic macromolecule) is a polymer having an ionicity (electrolytic property) (that is, a polymer electrolyte). The ionic polymer may be an anionic polymer, a cationic polymer, or an amphoteric polymer (e.g., a polymer having both a carboxyl group and an amino group).

According to the present invention, representatively, the ionic polymer may be selected depending on the species of the semiconductor. That is, (i) when the semiconductor is an n-type semiconductor, an ionic polymer containing an anionic polymer may be selected, or (ii) when the semiconductor is a p-type semiconductor, an ionic polymer containing the cationic polymer may be selected. Such a combination of the semiconductor and the ionic polymer can efficiently impart an excellent electricity storage function to the photoelectric conversion layer, although that reason is not known exactly.

In particular, according to the present invention, usually, the anionic polymer or the cationic polymer can preferably be used. The anionic polymer may particularly preferably be used (in particular, combination the n-type semiconductor and the ionic polymer containing an anionic polymer may be selected). Probably because the anionic polymer or the cationic polymer is easily bonded and fixed on the surface of the semiconductor (e.g., titanium oxide) by chemical bonding, hydrogen bonding, or other bondings, the anionic polymer or the cationic polymer seems to act as a binder preferably. In particular, the ionic polymer may be an ion exchange resin (or an ion exchanger or a solid polymer electrolyte).

The anionic polymer is usually a polymer having an acidic group [such as a carboxyl group or a sulfo group (or a sulfonic acid group)]. The anionic polymer may contain a single kind (species) or not less than two kinds (species) of acidic groups (or acid radicals). The acidic groups may partly or wholly be neutralized.

The representative examples of the anionic polymer [or a cation exchange resin (a cation-type ion exchange resin, an acid-type ion exchange resin)] may include a strongly acidic cation exchange resin, a slightly acidic cation exchange resin {for example, an ion exchange resin having a carboxyl group [e.g., a (meth)acrylic acid polymer (e.g., a poly(meth) acrylic acid; a copolymer of (meth)acrylic acid and another copolymerizable monomer (such as a crosslinkable monomer), such as a methacrylic acid-divinylbenzene copolymer or an acrylic acid-divinylbenzene copolymer), and a fluorine-containing resin having a carboxyl group (a perfluorocarboxylic acid resin)].

Among them, a preferred anionic polymer may include a strongly acidic cation exchange resin. As the strongly acidic ion exchange resin, for example, there may be mentioned a fluorine-containing resin having a sulfo group {for example, a fluorosulfonic acid resin (in particular, a perfluorosulfonic acid resin), such as a copolymer of a fluoroalkene and a sulfofluoroalkyl-fluorovinyl ether [e.g., a tetrafluoroethylene-[2-(2-sulfotetrafluoroethoxy)hexafluoropropoxy]trifluoro ethylene copolymer (e.g., a graft copolymer)]}, and a styrenic resin having a sulfo group [for example, a polystyrenesulfonic acid, and a sulfonated product of a crosslinked styrenic polymer (e.g., a sulfonated product of a styrene-divinylbenzene copolymer)].

The fluorine-containing resin having a sulfo group is available as the trade name "Nafion" series from DuPont, or others.

The anionic polymer may have acidity, neutrality, or alkalinity. In particular, according to the present invention, an anionic polymer having a relatively small pH value may preferably be used. Probably because an anionic polymer having a small pH value is used in combination with a semiconductor (in particular, an n-type semiconductor) to easily form an electric double layer in an electrolytic solution, a sufficient electricity storage function is easily obtained in many cases. Although that reason is not known exactly, a possible factor includes that the charge easily accumulates on the semiconductor due to rich protons. Such an anionic polymer (e.g., a strongly acidic cation exchange resin) or an ionic polymer containing an anionic polymer may have a pH value (25° C.) selected from the range of not more than 10 (e.g., 0.1 to 8), for example, a pH value of less than 7 (e.g., 0.15 to 6.5), preferably not more than 6 (e.g., 0.2 to 5), more preferably not more than 4 (e.g., 0.3 to 3), particularly not more than 2 (e.g., 0.5 to 1.5), and usually not more than 3 (e.g., 1 to 3). The pH value may be a pH value of an aqueous solution or water dispersion of the ionic polymer (or a pH value in a water-containing solvent). In other words, the pH value may be a (pH) value of a solution (such as an aqueous solution) or a dispersion (such as a water dispersion) obtained by dissolving or dispersing the ionic polymer in water or a water-containing solvent at 25° C.

The pH value can be adjusted by a conventional method (for example, neutralization of an acidic group with an appropriate basic group). In a case where the acidic group is neutralized, a counter ion of the neutralized acidic group may include, but should not be limited to, for example, an alkali metal (e.g., sodium, potassium).

In a case where the ionic polymer contains the anionic polymer, the ionic polymer may contain the anionic polymer alone or may contain the anionic polymer and another ionic polymer (e.g., an amphoteric polymer) in combination. In such a case, the proportion of the anionic polymer in the ionic polymer may be, for example, not less than 30%, by weight (e.g., 40 to 99% by weight), preferably not less than 50% by weight (e.g., 60 to 98% by weight), and more preferably not less than 70% by weight (e.g., 80 to 97% by weight).

The cationic polymer is usually a polymer having a basic group (an alkaline group). The basic group may include, for example, an amino group [for example, a primary, secondary or tertiary amino group, such as an amino group or a substituted amino group (e.g., a mono- or di-alkylamino group, such as dimethylamino group)], an imino group (—NH—, —N<), and a quaternary ammonium base (e.g., a trialkylammonium base, such as trimethylammonium base).

The cationic polymer may have these basic groups alone or in combination. The basic groups may partly or wholly be neutralized.

The representative examples of the cationic polymer [or an anion exchange resin (an anion-type ion exchange resin, a base-type ion exchange resin)] may include an amine-series polymer, an imine-series polymer, and a quaternary-ammonium-base-containing polymer. The amine-series polymer may include, for example, an allylamine-series polymer [a homo- or co-polymer of an allylamine-series monomer (e.g., allylamine, diallylamine, and a diallylalkylamine (such as diallylmethylamine or diallylethylamine)), such as a polyallylamine, an allylamine-dimethylallylamine copolymer, or a diallylamine-sulfur dioxide copolymer (including not only a copolymer of a plurality of allylamine-series monomers but also a copolymer of an allylamine-series monomer and a copolymerizable monomer; hereinafter, the same applies in a similar expression)], a vinylamine-series polymer (e.g., a homo- or co-polymer of a vinylamine-series monomer, such as a polyvinylamine), a (meth)acrylic polymer having an amino group [for example, a homo- or co-polymer of a (meth)acrylic monomer having an amino group, e.g., an aminoalkyl(meth)acrylate (e.g., an N-mono- or di-alkyl-amino$C_{1-4}$alkyl(meth)acrylate, such as N,N-dimethylaminoethyl(meth)acrylate or N,N-dimethylaminopropyl(meth)acrylate; and an aminoalkyl(meth)acrylamide (e.g., an N-mono- or di-alkyl-amino$C_{1-4}$alkyl(meth)acrylamide, such as N,N-dimethylaminoethyl(meth)acrylamide)], a heterocyclic amine-series polymer [e.g., an imidazole-series polymer (e.g., a polyvinylimidazole), a pyridine-series polymer (e.g., a polyvinylpyridine), and a pyrrolidone-series polymer (e.g., a polyvinylpyrrolidone)], an amine-modified epoxy resin, and an amine-modified silicone resin. As the imine-series polymer, for example, there may be mentioned a homo- or co-polymer of an imine-series monomer, such as a polyalkyleneimine (e.g., a polyethyleneimine).

In the quaternary-ammonium-base-containing polymer, the salt may include, but should not be limited to, for example, a halide salt (e.g., a chloride, a bromide, and an iodide), a carboxylate salt (e.g., a salt of an alkanoic acid, such as an acetate), and a sulfonate salt.

The quaternary-ammonium-base-containing polymer may include, for example, a polymer in which an amino group or imino group of the above-exemplified amine-series polymer or imine-series polymer is replaced with a quaternary ammonium base {for example, a homo- or co-polymer of an N,N,N-trialkyl-N-(meth)acryloyloxyalkylammonium salt [e.g., a tri$C_{1-10}$alkyl(meth)acryloyloxy$C_{2-4}$alkylammonium salt, such as trimethyl-2-(meth)acryloyloxyethylammonium chloride or N,N-dimethyl-N-ethyl-2-(meth)acryloyloxyethylammonium chloride]}, and in addition, a vinylaralkylammonium-salt-series polymer, a cationized cellulose, and a polymer in which a quaternary ammonium base is introduced into a styrene-divinylbenzene copolymer. The vinylaralkylammonium-salt-series polymer may include, for example, a homo- or co-polymer of a vinylaralkylammonium salt [for example, an N,N,N-trialkyl-N-(vinylaralkyl)ammonium salt (e.g., a tri$C_{1-10}$alkyl (vinyl-$C_{6-10}$aryl$C_{1-4}$alkyl)ammonium salt, such as trimethyl-p-vinylbenzylammonium chloride, N,N-dimethyl-N-ethyl-p-vinylbenzylammonium chloride, or N,N-diethyl-N-methyl-N-2-(4-vinylphenyl)ethylammonium chloride), and an N,N-dialkyl-N-aralkyl-N-(vinylaralkyl)ammonium salt (e.g., an N,N-di$C_{1-10}$alkyl-N—$C_{6-10}$aryl$C_{1-4}$alkyl-N-(vinyl-$C_{6-10}$aryl$C_{1-4}$alkyl) ammonium salt, such as N,N-dimethyl-N-benzyl-p-vinylbenzylammonium chloride)]. The cationized cellulose may include, for example, a reaction product of a hydroxy-group-containing cellulose derivative (e.g., a hydroxy$C_{2-4}$alkyl cellulose, such as a hydroxyethyl cellulose) and an epoxy compound having a quaternary ammonium base (e.g., a trialkylammonium base) (e.g., an N,N,N-trialkyl-N-glycidylammonium salt).

For example, the cationic cellulose (cationized cellulose) is available as the trade name "JELLNER" from Daicel Corporation; the polyallylamine is available as the trade name "PAA" series from Nittobo Medical Co., Ltd.; and the amine-modified silicone resin is available as the trade name "KF" series from Shin-Etsu Chemical Co., Ltd.

A preferred cationic polymer may include a strongly basic cationic polymer (anion exchange resin), such as a quaternary-ammonium-base-containing polymer.

The cationic polymer may have acidity, neutrality, or alkalinity. In particular, according to the present invention, in the combination with a p-type semiconductor, a cationic polymer having a relatively large pH value may preferably be used. Such a cationic polymer (for example, a strongly basic anion exchange resin) or an ionic polymer containing such a cationic polymer may have a pH value (25° C.) selected from the range of not less than 5 (e.g., 6 to 14), for example, a pH value of not less than 7 (e.g., 7.5 to 14), preferably not less than 8 (e.g., 8.5 to 14), more preferably not less than 9 (e.g., 9.5 to 13.5), and particularly not less than 10 (e.g., 10.5 to 13). The pH value may be a pH value of an aqueous solution or aqueous dispersion of the ionic polymer (or a pH value in a water-containing solvent). In other words, the pH value may be a (pH) value of a solution (such as an aqueous solution) or a dispersion (such as an aqueous dispersion) obtained by dissolving or dispersing the ionic polymer in water or a water-containing solvent (aqueous solvent) at 25° C. The pH value can be adjusted by a conventional method (for example, neutralization of a basic group with an appropriate acidic group).

In a case where the ionic polymer contains the cationic polymer, the ionic polymer may contain the cationic polymer alone or may contain the cationic polymer and another ionic polymer (e.g., an amphoteric polymer) in combination. In such a case, the proportion of the cationic polymer in the ionic polymer may be, for example, not less than 30% by weight (e.g., 40 to 99% by weight), preferably not less than 50% by weight (e.g., 60 to 98% by weight), and more preferably not less than 70% by weight (e.g., 80 to 97% by weight).

The ionic polymer (such as the anionic polymer or the cationic polymer) may or may not have a crosslinked structure (for example, a (meth)acrylic acid-divinylbenzene copolymer or a sulfonated product of a styrenic polymer, as exemplified above). According to the present invention, in particular, an ionic polymer being free from a crosslinked structure (or having a very low degree of crosslinking) may preferably be used.

The ionic polymer (ion exchange resin) may have an ion exchange capacity of about 0.1 to 5.0 meq/g (e.g., about 0.15 to 4.0 meq/g), preferably about 0.2 to 3.0 meq/g (e.g., about 0.3 to 2.0 meq/g), more preferably about 0.4 to 1.5 meq/g, and particularly about 0.5 to 1.0 meq/g.

The molecular weight of the ionic polymer is not particularly limited to a specific range as far as the ionic polymer can be dissolved or dispersed in a solvent.

The ionic polymer may be used alone or in combination.

The ratio of the ionic polymer relative to 1 part by weight of the semiconductor can be selected from the range of not less than 0.05 parts by weight (e.g., about 0.07 to 100 parts by weight) and may for example be not less than 0.1 parts by weight (e.g., about 0.1 to 50 parts by weight), preferably not less than 0.15 parts by weight (e.g., about 0.15 to 30 parts by weight), more preferably not less than 0.2 parts by weight (e.g., about 0.2 to 20 parts by weight), and usually about 0.1 to 10 parts by weight [for example, about 0.1 to 8 parts by weight (e.g., about 0.1 to 7 parts by weight), preferably about 0.15 to 5 parts by weight (e.g., about 0.15 to 3 parts by weight), and more preferably about 0.2 to 2 parts by weight (e.g., about 0.2 to 1 part by weight)]. Combination of the semiconductor and the ionic polymer in the ratio described above (further, selective combination of the semiconductor and the ionic polymer as described above) allows efficient production of a photoelectric conversion layer having an electricity storage function.

(Dye)

According to the present invention, the composition may further contain a dye. The dye allows efficient production of a dye-sensitized photoelectric conversion layer or a dye-sensitized photoelectric conversion element (such as a dye-sensitized solar cell).

The dye (a dyestuff (or a coloring matter), a pigment) is not particularly limited to a specific one as far as the dye is a component that functions as a sensitizer (a sensitizing dye, a photosensitizing dye) (or a component showing a sensitizing action). The dye may include, for example, an organic dye, an inorganic dye (for example, a carbon pigment (or carbonaceous pigment), a chromate pigment, a cadmium pigment, a ferrocyanide pigment, a metal-oxide pigment, a silicate pigment, and a phosphate pigment). The dye may be used alone or in combination.

As the organic dye (an organic dyestuff or an organic pigment), there may be mentioned, for example, a ruthenium complex dye {for example, a pyridine complex of ruthenium, such as a bipyridine complex of ruthenium [e.g., cis-bis(isothiocyanato)bis(2,2'-bipyridyl-4,4'-dicarboxylato) ruthenium(II) bistetrabutylammonium (another name: N719), cis-bis(isothiocyanato)(2,2'-bipyridyl-4,4'-dicarboxylato) (2,2'-bipyridyl-4,4'-dinonyl)ruthenium(II), cis-bis (isothiocyanato)bis(2,2'-bipyridyl-4,4'-dicarboxylato)ruthenium(II), cis-bis(cyanide)(2,2'-bipyridyl-4,4'-dicarboxylato) ruthenium(II), and tris(2,2'-bipyridyl-4,4'-dicarboxylato) ruthenium(II) dichloride] or a terpyridine complex of ruthenium [e.g., tris(isothiocyanato)ruthenium(II)-2,2':6',2"-terpyridine-4,4',4"-tricarboxylic acid tristetrabutylammonium salt]}, an osmium complex dye, a porphyrin dye (such as magnesium porphyrin or zinc porphyrin), a chlorophyll dye (such as chlorophyll), a xanthene dye (such as rhodamine B or erythrosine), a cyanine dye (such as merocyanine, quinocyanine, or cryptocyanine), a phthalocyanine dye, an azo dye, a perylene dye, a perinone dye, a coumarin dye, a quinone dye, an anthraquinone dye, a squarylium dye, an azomethine dye, a quinophthalone dye, a quinacridone dye, an isoindoline dye, a nitroso dye, a pyrrolo-pyrrole dye, and a basic dye (such as methylene blue).

Among these dyes, a preferred one includes the organic dye, in particular, the ruthenium complex dye. Moreover, a dye having a functional group, such as a carboxyl group, an ester group, or a sulfo group, as a ligand (for example, a ruthenium dye having a carboxyl group, such as N719) is also preferred. The dye having such a ligand is preferred because the dye is easily bonded and hardly detached to the surface of the semiconductor (such as titanium oxide).

The dye is usually contained in the photoelectric conversion layer (or photoelectric conversion element) in the state in which the dye is attached (or fixed) to the semiconductor (or the surface of the semiconductor). A manner of the attachment (of fixation) may include adsorption (physical adsorption), chemical bonding, and others. Thus a dye that is easily attached to the semiconductor may preferably be selected.

The ratio (attachment or adsorption ratio) of the dye is not particularly limited. For example, the ratio of the dye may be selected so that the following formula can be satisfied in relationship to the semiconductor and the ionic polymer:

$$0<(I_A \times I_S + D_A \times D_S)/S_S \leq 1$$

wherein $I_A$ represents the number of ionic groups in the ionic polymer, $I_S$ represents an area for one ionic group to occupy, $D_A$ represents the number of the dye (dye molecules), $D_S$ represents an area for one dye molecule to occupy, $S_S$ represents a surface area of the semiconductor.

In the above-mentioned formula, $I_A$ is the total number of ionic groups. For example, $I_A$ can be determined by multiplying the ion exchange capacity (meq/g) of the ionic polymer by the weight (g) of the ionic polymer and the Avogadro number; usually $I_A \times I_S < S_S$. $I_S$ and $D_S$ are an area (m$^2$) for one ionic group to occupy and an area (m$^2$) for one dye molecule to occupy, respectively, and can use values that can made these areas largest.

A concrete ratio of the dye relative to 1 part by weight of the semiconductor may be, for example, about 0.001 to 1 part by weight (e.g., about 0.003 to 0.7 parts by weight), preferably about 0.005 to 0.5 parts by weight (e.g., about 0.007 to 0.3 parts by weight), and more preferably about 0.01 to 0.2 parts by weight (e.g., about 0.02 to 0.1 parts by weight).

According to the present invention, the composition may be a solvent-containing composition (a coating composition). The solvent may include, but should not be limited to, an organic solvent [for example, an alcoholic solvent (e.g., an alkanol, such as methanol, ethanol, isopropanol, or butanol), an aromatic solvent (e.g., an aromatic hydrocarbon, such as toluene or xylene), an ester-series solvent (e.g., an acetate, such as ethyl acetate, butyl acetate, or propylene glycol monomethyl ether monoacetate), a ketone-series solvent (e.g., a chain ketone, such as acetone; and a cyclic ketone, such as cyclohexanone), an ether-series solvent (e.g., a chain ether, such as propylene glycol monomethyl ether or diethylene glycol dimethyl ether; and a cyclic ether, such as dioxane or tetrahydrofuran), a halogen-containing solvent (e.g., an haloalkane, such as dichloromethane or chloroform), a nitrile-series solvent (e.g., acetonitrile and benzonitrile), and a nitro-series solvent (e.g., nitrobenzene)], water, and others. These solvents may be used alone or in combination.

In the solvent-containing composition, the solid (or nonvolatile component) content can suitably be selected according to a coating method for forming the photoelectric conversion layer (or photoelectrically convertible layer), and may be, for example, about 0.1 to 90% by weight (e.g., about 0.5 to 70% by weight), preferably about 1 to 50% by weight (e.g., about 5 to 40% by weight), and more preferably about 10 to 30% by weight. According to the present invention, the proportion of the ionic polymer can be relatively large. Thus the semiconductor can possess a sufficient dispersion stability even in a case where the solid containing the semiconductor has a high concentration.

The pH value of the solvent-containing composition is not particularly limited to a specific one. As described above, an appropriate pH range may be selected, according to the species of the ionic polymer or the combination of the semiconductor and the ionic polymer. For example, in a case where the ionic polymer contains the anionic polymer, the pH value of the solvent-containing composition (25° C.) may be selected from the range of not more than 10 (e.g., 0.1 to 8), and may be, for example, less than 7 (e.g., 0.15 to 6.5), preferably not more than 6 (e.g., 0.2 to 5), more preferably not more than 4 (e.g., 0.3 to 3), particularly not more than 2 (e.g., 0.5 to 1.5), and usually not more than 3 (e.g., 1 to 3).

In a case where the ionic polymer contains the cationic polymer, the pH value of the solvent-containing composition (25° C.) may be selected from the range of not less than 5 (e.g., 6 to 14), and may be, for example, not less than 7 (e.g., 7.5 to 14), preferably not less than 8 (e.g., 8.5 to 14), more preferably not less than 9 (e.g., 9.5 to 13.5), and particularly not less than 10 (e.g., 10.5 to 13).

According to the present invention, the composition can be obtained by mixing these components (e.g., the semiconductor, the ionic polymer, and, if necessary, the dye). For example, the solvent-containing composition may be prepared by mixing these components in the solvent, or may be prepared by mixing these components (e.g., the semiconductor and the ionic polymer) and then mixing (or dispersing) the mixture in the solvent. As described above, the semiconductor, such as titanium oxide, may be in the form of a dispersion, and the dispersion may be mixed with the ionic polymer (and the dye). In a case where the pH of the composition is adjusted as described above, the pH adjustment may be carried out in an appropriate stage. For example, the pH of the semiconductor dispersion may be adjusted within the above-describe range before the dispersion was mixed with the ionic polymer (and the dye), or the pH of the composition may be adjusted in the mixture system of the semiconductor (or the dispersion thereof) and the ionic polymer (and the dye).

The dye may be mixed with the semiconductor and the ionic polymer beforehand. Alternatively, the dye may be coated (attached) on a coating layer that has been formed by applying the composition containing the semiconductor and the ionic polymer on a substrate. According to the present invention, as described later, since it is not necessary to sinter (burn) the semiconductor, the semiconductor and the ionic polymer can be mixed beforehand.

According to the present invention, the composition is useful for forming a photoelectric conversion layer (or a photoelectric conversion layer that constitutes a photoelectric conversion element). The photoelectric conversion layer is usually formed on a substrate. That is, the photoelectric conversion layer and the substrate constitutes (or forms) a laminate. Hereinafter, the photoelectric conversion layer and a process for producing the layer will be described in detail.

[Laminate and Process for Producing the Same]

According to the present invention, the laminate (electrode) comprises a substrate and a photoelectric conversion layer laminated on or over the substrate (or a photoelectric conversion layer formed from the composition).

The substrate may usually be a conductive substrate according to purposes. The conductive substrate may contain an electric conductor (or an electric conductor layer) alone. The conductive substrate may usually include a substrate having an electric conductor layer (or a conductive layer or a conductive film) formed on or over a base substrate. In such a case, the photoelectric conversion layer is formed on or over the electric conductor layer.

The electric conductor (conducting agent) may suitably be selected according to purposes. For example, the electric conductor may include an electric conductor, such as a conductive metal oxide [for example, tin oxide, indium oxide, zinc oxide, an antimony-doped metal oxide (e.g., antimony-doped tin oxide), a tin-doped metal oxide (e.g., tin-doped indium oxide), an aluminum-doped metal oxide (e.g., aluminum-doped zinc oxide), a gallium-doped metal oxide (e.g., gallium-doped zinc oxide), and a fluorine-doped metal oxide (e.g., fluorine-doped tin oxide)]. These electric conductors may be used alone or in combination. The electric conductor may usually be a transparent electric conductor.

The base substrate may include an inorganic substrate (e.g., a glass), an organic substrate [for example, a substrate or film (a plastic substrate or a plastic film) formed from a plastic, e.g., a polyester-series resin (e.g., a poly(ethylene terephthalate) and a poly(ethylene naphthalate)), a polycarbonate resin, a cycloolefin-series resin, a polypropylene-series resin, a cellulose-series resin (such as a cellulose triacetate), a polyether-series resin (such as a polyether sulfone), a polysulfide-series resin (such as a poly(phenylene sulfide)), and a polyimide resin], and others. According to the present invention, since a step of sintering the semiconductor is not necessary, a plastic substrate (a plastic film) can be used as the base material.

The photoelectric conversion layer can be formed by applying (or coating) the composition on the substrate (the electric conductor layer). Examples of the applying (or coating) method may include, but should not be limited to, an air knife coating, a roll coating, a gravure coating, a blade coating, a doctor blading, a squeegeeing, a dip coating, a spraying, a spin coating, an ink jet printing, and others. After application (or coating), the coated substrate may be dried at a predetermined temperature (for example, a temperature of a room temperature to about 150° C.).

The dye may be added to the photoelectric conversion layer by applying the semiconductor and the ionic polymer on the substrate and then attaching the dye to the coat containing the semiconductor and ionic polymer, as described above. A method of attaching the dye may include a method of spraying the coat with a dye-containing solution, a method of immersing the substrate having the coat in a dye-containing solution, and other methods. After spraying or immersion, the resulting substrate may be dried in the same manner as described above.

According to the present invention, after the composition is applied on the substrate, the photoelectric conversion layer is formed without sintering (or burning) the semiconductor [or without a heat treatment at a high temperature (e.g., a temperature of not lower than 400° C.)]. According to the present invention, a photoelectric conversion layer having an excellent photoelectric conversion characteristic can be formed without the sintering step. Although sintering makes the specific surface area of the semiconductor small, the present invention allows the formation of the photoelectric conversion layer without sintering as described above. Thus the surface area derived from the semiconductor can be maintained, which is preferred.

As described above, the photoelectric conversion layer is formed on the substrate (conductive substrate) to give an electrode (laminate). The electrode may have a thickness of, for example, about 0.1 to 100 μm (e.g., about 0.3 to 70 μm), preferably about 0.5 to 50 μm (e.g., about 0.7 to 40 μm), and more preferably about 1 to 30 μm. The photoelectric conversion layer may have a thickness of, for example, about 0.1 to 100 μm (e.g., about 0.3 to 70 μm), preferably about 0.5 to 50 μm (e.g., about 1 to 30 μm), and more preferably about 3 to 20 μm.

The laminate obtainable as above has the electrically conductive layer and the photoelectric conversion layer and is available as an electrode constituting a photoelectric conversion element. Hereinafter, the photoelectric conversion element will be described in detail.

[Photoelectric Conversion Element]

The photoelectric conversion element (or photoelectric conversion device) is provided with the laminate (electrode). Specifically, the photoelectric conversion element (cell) is provided with the electrode and a counter electrode to the electrode. An example of representative photoelectric conversion elements includes a solar cell. In particular, in a case where the photoelectric conversion layer contains the dye, the photoelectric conversion element forms a dye-sensitized solar cell.

The solar cell is provided with, for example, a laminate as an electrode, a counter electrode [a counter electrode that is disposed to face the electrode (the photoelectric conversion layer of the electrode)], and an electrolyte layer sealed between these electrodes. In other words, the electrolyte layer (or electrolyte) exists (or is sealed) in a space or gap that is made by sealing (or encapsulating) both electrodes (or borders thereof) with a sealant (or an encapsulant) [for example, a sealant containing a thermoplastic resin (such as an ionomer resin), a thermosetting resin (such as an epoxy resin or a silicone resin), or others].

The counter electrode is a positive electrode or a negative electrode depending on the species of the semiconductor constituting the electrode (or the laminate). Specifically, in a case where the semiconductor is an n-type semiconductor, the counter electrode forms a positive electrode (the laminate forms a negative electrode); in a case where the semiconductor is a p-type semiconductor, the counter electrode forms a negative electrode (the laminate forms a positive electrode).

The counter electrode comprises a conductive substrate and a catalyst layer (a positive electrode catalyst layer or a negative electrode catalyst layer) formed on or over the conductive substrate (or the electric conductor layer of the conductive substrate), as is the case with the laminate. In a case where the electric conductor layer has a reducing power in addition to conductivity, the catalyst layer is not necessarily needed. Incidentally, the electric conductor layer or the catalyst layer of the counter electrode faces the laminate (or electrode). In the counter electrode, the conductive substrate may be the same substrate as above or may be a substrate having a layer (a conductive catalyst layer) that is formed on or over the base substrate and functions as both an electric conductor layer and a catalyst layer, as described later. The catalyst layer (positive electrode catalyst layer or negative electrode catalyst layer) can be formed from a conductive metal (such as gold or platinum), carbon, or the like, without particular limitation.

The catalyst layer may be a non-porous layer (or a layer having a non-porosity) or may be a layer having a porous structure (a porous layer). In particular, the counter electrode preferably includes an electrode having a porous layer (specifically, an electrode having a porous layer on an outermost surface thereof). Combination of electrode having such a porous layer and the photoelectric conversion layer can efficiently show an electricity storage function, and it is easy to obtain a photoelectric conversion element having a large electricity storage.

In the electrode (counter electrode), the porous layer is practically a layer (a porous catalyst layer) that functions as a catalyst layer (a positive electrode catalyst layer or a negative electrode catalyst layer). The porous catalyst layer may contain (i) a porous catalyst component (a catalyst component having a porosity) or (ii) a porous component (a component having a porosity) and a catalyst component supported to the porous component. The porous catalyst layer may also contain the above (i) and (ii) in combination. That is, the porous catalyst component has a porosity and functions as a catalyst component (or has both a porosity and a catalyst function). In the embodiment (ii), the porous component may have a catalyst function.

The porous catalyst component may include, for example, a metal fine particle (e.g., platinum black) and a porous carbon [e.g., an activated carbon; a graphite; a carbon black (a carbon black aggregate), such as ketjen black, furnace black, or acetylene black; and a carbon nanotube (a carbon nanotube aggregate)]. These components may be used alone or in combination. Among the porous catalyst components, the activated carbon or the like can preferably be used.

As the porous component, there may be mentioned, in addition to the above-mentioned porous carbon, a metal compound particle [for example, a particle (a fine particle) of the above-exemplified conductive metal oxide (e.g., tin-doped indium oxide)], and others. These components may be used alone or in combination. The catalyst component may include a conductive metal (e.g., gold and platinum), and others.

The form (or shape) of the porous catalyst component and that of the porous component may include, but should not be limited to, a particulate form, a fibrous form, and others. The form preferably includes a particulate form.

The particulate porous catalyst component and the porous component (porous particle) each may have an average particle diameter of, for example, about 1 to 1000 μm (e.g., about 5 to 700 μm), preferably about 10 to 500 μm (e.g., about 20 to 400 μm), more preferably about 30 to 300 μm (e.g., about 40 to 200 μm), and particularly about 50 to 150 μm (e.g., about 70 to 100 μm).

The porous catalyst component and the porous component each may have a specific surface area of, for example, about 1 to 4000 m$^2$/g (e.g., about 10 to 3500 m$^2$/g), preferably about 20 to 3000 m$^2$/g (e.g., about 30 to 2500 m$^2$/g), more preferably about 50 to 2000 m$^2$/g (e.g., about 100 to 1500 m$^2$/g), and particularly about 200 to 1000 m$^2$/g (e.g., about 300 to 500 m$^2$/g).

If necessary, the porous layer (porous catalyst layer) may contain a binder component, for example, a resin component [e.g., a thermoplastic resin, such as a cellulose derivative (a methyl cellulose); and a thermosetting resin, such as an epoxy resin].

The proportion of the binder component in the porous layer (porous catalyst layer) may be, for example, about 0.1 to 50% by weight, preferably about 0.5 to 40% by weight, and more preferably about 1 to 30% by weight (e.g., about 3 to 20% by weight).

The electrode having the porous layer is not particularly limited to a specific one as far as the electrode at least contains the porous layer. The electrode having the porous layer is usually at least provided with a substrate (a substrate which may be a conductive substrate) and a porous catalyst layer. Representative examples of the electrode having the porous layer may include (i) an electrode (or laminate) provided with a conductive substrate (such as a substrate having an electric conductor layer formed on or over a base substrate, or the above-exemplified conductive substrate) and a porous catalyst layer that is formed on or over the conductive substrate (or electric conductor layer) and is composed of a porous catalyst component and (ii) an electrode (or laminate) provided with a base substrate (such as the above-exemplified base substrate) and a porous catalyst layer that is formed on or over the base substrate and is composed of a porous component and a catalyst component (e.g., a porous component having a catalyst component supported thereto).

The porous layer (porous catalyst layer) may have a thickness of, for example, about 0.1 to 100 μm (e.g., about 0.3 to 70 μm), preferably about 0.5 to 50 μm (e.g., about 0.7 to 40 μm), and more preferably about 1 to 30 μm.

The electrolyte layer may be formed from an electrolytic solution containing an electrolyte and a solvent or may be formed from a solid (or a gel) containing an electrolyte. The electrolyte constituting the electrolytic solution may include, but should not be limited to, a general-purpose electrolyte, for example, a combination of a halogen (halogen molecule) and a halide salt [e.g., a combination of bromine and a bromide salt, and a combination of iodine and an iodide salt]. The counter ion (cation) constituting the halide salt may include a metal ion [for example, an alkali metal ion (e.g., lithium ion, sodium ion, potassium ion, and cesium ion) and an alkaline earth metal ion (e.g., magnesium ion and calcium ion)], and a quaternary ammonium ion [such as a tetraalkylammonium salt, a pyridinium salt, or an imidazolium salt (e.g., 1,2-dimethyl-3-propylimidazolium salt)]. These electrolytes may be used alone or in combination.

Among them, a preferred electrolyte may include a combination of iodine and an iodide salt, in particular, a combination of iodine and a metal iodide salt [such as an alkali metal salt (such as lithium iodide, sodium iodide, or potassium iodide) or a quaternary ammonium salt].

The solvent constituting the electrolytic solution is not particularly limited to a specific one, and a general-purpose solvent can be used. For example, the solvent may include an alcohol compound (e.g., an alkanol, such as methanol, ethanol, or butanol; and an glycol, such as ethylene glycol, diethylene glycol, or a poly(ethylene glycol)), a nitrile compound (such as acetonitrile, methoxyacetonitrile, propionitrile, 3-methoxypropionitrile, or benzonitrile), a carbonate compound (such as ethylene carbonate, propylene carbonate, or diethyl carbonate), a lactone compound (such as γ-butyrolactone), an ether compound (a chain ether, such as 1,2-dimethoxyethane, dimethyl ether, or diethyl ether; a cyclic ether, such as tetrahydrofuran, 2-methyltetrahydrofuran, dioxolane, or 4-methyldioxolane), a sulfolane compound (such as sulfolane), a sulfoxide compound (such as dimethylsulfoxide), an amide compound (such as N,N-dimethylformamide or N,N-dimethylacetamide), and water. The solvents may be used alone or in combination.

In the photoelectric conversion element, the ionic polymer is allowed to contact with the electrolytic solution (or the ionic polymer exists in the electrolytic solution). As described above, in a case where the pH of the ionic polymer is adjusted, it is preferred to maintain the pH of the ionic polymer in the photoelectric conversion element. Specifically, for the ionic polymer containing the anionic polymer, the pH value (25° C.) of the electrolytic solution (the ionic polymer in the electrolytic solution) may be selected from the range of not more than 10 (e.g., 0.1 to 8), and may be, for example, less than 7 (e.g. 0.15 to 6.5), preferably not more than 6 (e.g., 0.2 to 5), more preferably not more than 4 (e.g., 0.3 to 3), particularly not more than 2 (e.g., 0.5 to 1.5), and usually not more than 3 (e.g., 1 to 3).

For the ionic polymer containing the cationic polymer, the pH value (25° C.) of the electrolytic solution (the ionic polymer in the electrolytic solution) may be selected from the range of not less than 5 (e.g., 6 to 14), and may be, for example, not less than 7 (e.g., 7.5 to 14), preferably not less than 8 (e.g., 8.5 to 14), more preferably not less than 9 (e.g., 9.5 to 13.5), and particularly not less than 10 (e.g., 10.5 to 13).

From the viewpoint of the pH adjustment, a component that does not affect the pH adjustment may preferably be used as the component constituting the electrolytic solution. For example, for the ionic polymer containing the anionic polymer, a neutral solvent or a non-basic solvent (e.g., an amine-free solvent) may preferably be used as the electrolytic solution. In contrast, for the ionic polymer containing the cationic polymer, a neutral solvent or a non-acidic solvent (or an aprotic solvent) may preferably be used as the electrolytic solution.

The electrolyte in the electrolytic solution may have a concentration of, for example, about 0.01 to 10 M, preferably about 0.03 to 8 M, and more preferably about 0.05 to 5 M. In the combination of the halogen (such as iodine) and the halide salt (such as an iodide salt), the ratio (molar ratio) may be about 1/0.5 to 1/100, preferably about 1/1 to 1/50, and more preferably about 1/2 to 1/30 at a ratio of the halogen/the halide salt.

The electrolyte constituting the solid layer containing the electrolyte may include the above-exemplified electrolyte, and in addition, a solid electrolyte {for example, an organic solid component, such as a resin component [e.g., a thiophene-series polymer (such as a polythiophene) and a carbazole-series polymer (such as a poly(N-vinylcarbazole))] or a low-molecular-weight organic component (e.g., naphthalene, anthracene, and phthalocyanine); and an inorganic solid component (such as silver iodide)}. These components may be used alone or in combination.

The solid layer may be a solid layer in which the electrolyte or the electrolytic solution is supported to a gel base material [for example, a thermoplastic resin (such as a poly(ethylene glycol) or a poly(methyl methacrylate)) or a thermosetting resin (such as an epoxy resin)].

EXAMPLES

The following examples are intended to describe this invention in further detail and should by no means be interpreted as defining the scope of the invention.

Example 1

A titanium oxide dispersion was prepared by mixing 10 parts by weight of a titanium oxide particle ("ST-01" manufactured by Ishihara Sangyo Kaisha, Ltd., average primary particle diameter: 7 nm, specific surface area: 300 m$^2$/g, anatase-form crystal), 25 parts by weight of an anionic-polymer-containing dispersion ("Nafion 117" manufactured by Aldrich, 20% dispersion containing water and 1-propanol, ion exchange capacity: 0.95 to 1.03 meq/g, pH (25° C.)=1, area for one molecule to occupy: about 0.024 nm$^2$) (that is, 5 parts by weight of an anionic polymer), 0.1 parts by weight of a dye (N719, manufactured by Tokyo Chemical Industry Co., Ltd., molecular weight: 1188.57, area for one molecule to occupy: about 1 nm$^2$), and 65 parts by weight of methanol.

The resulting titanium oxide particle dispersion was applied on an ITO layer of an ITO-attached glass substrate (manufactured by Luminescence Technology Corp., size: 25 mm×25 mm, thickness of ITO layer: 0.14 μm) by squeegeeing and then dried at 70° C. in the atmosphere to give a substrate having a dye-adsorbed titanium oxide electrode (negative electrode) formed thereon (thickness of dried coat: 5 μm).

As a counter electrode having a porous layer, an electrode composed of an ITO-attached glass substrate (manufactured by Luminescence Technology Corp., size: 25 mm×25 mm, thickness of ITO layer: 0.14 μm) and an activated carbon catalyst layer (thickness: 5 μm) was provided; wherein the activated carbon catalyst layer was formed by applying a slurry containing an activated carbon powder (manufactured by Tokyo Chemical Industry Co., Ltd.) (a 10% by weight water dispersion containing 1 part by weight of the activated carbon powder and 0.1 parts by weight of a methyl cellulose (manufactured by Tokyo Chemical Industry Co., Ltd.)) on the ITO layer by squeegeeing. The resulting dye-adsorbed titanium oxide electrode and the counter electrode were disposed so that both ITO layers (the dye-adsorbed side and the activated carbon catalyst layer side) faced each other at a distance 50 μm apart. The surrounding of these substrates (or these electrodes or these ITO layer sides) was sealed with a sealant or spacer ("Himilan" manufactured by Du Pont-Mitsui Polychemicals Co, Ltd.). A dye-sensitized solar cell was made by filling the gap or space between both substrates (or both electrodes) (or the space sealed with the sealant) with an electrolytic solution. As the electrolytic solution, an acetonitrile solution containing 0.5M lithium iodide and 0.05 M iodine was used.

The resulting dye-sensitized solar cell was evaluated using a solar simulator ("XES-301S+EL-100" manufactured by San-Ei Electric Co., Ltd.) under conditions of AM 1.5, 100 mW/cm$^2$ and 25° C.

Example 2

A slurry containing an ITO powder (manufactured by Aldrich, particle diameter: <50 nm, specific surface area: 27 m$^2$/g) (a 10% by weight water dispersion containing 1 part by weight of the ITO powder and 0.1 parts by weight of a methyl cellulose (manufactured by Tokyo Chemical Industry Co., Ltd.)) was applied on an ITO layer of an ITO-attached glass substrate to give a porous layer (thickness: 5 μm). The resulting substrate was covered with platinum (thickness: 3.5 nm) by sputtering to give an electrode. The resulting electrode was composed of the ITO-attached glass substrate and the porous layer. A dye-sensitized solar cell was produced and evaluated in the same manner as in Example 1 except that the resulting electrode was used as the counter electrode having a porous layer.

Example 3

A slurry containing a platinum on carbon powder ("IFPC40-II" manufactured by Ishifuku Metal Industry Co., Ltd.) (a 10% by weight water dispersion containing 1 part by weight of the platinum on carbon powder and 0.1 parts by weight of a methyl cellulose (manufactured by Tokyo Chemical Industry Co., Ltd.)) was applied on an ITO layer of an ITO-attached glass substrate to give a porous layer (thickness: 5 μm). The resulting electrode was composed of the ITO-attached glass substrate and the porous layer. A dye-sensitized solar cell was produced and evaluated in the same manner as in Example 1 except that the resulting electrode was used as the counter electrode having a porous layer.

Example 4

A dye-sensitized solar cell was produced and evaluated in the same manner as in Example 1 except that an electrode having a non-porous structure [an electrode composed of an ITO-attached glass substrate (manufactured by Luminescence Technology Corp., size: 25 mm×25 mm, thickness of ITO layer: 0.14 μm) and a platinum layer formed on an ITO layer of the substrate by sputtering (thickness of platinum layer: 3.5 nm, electrode area: 6.25 cm$^2$/g)] was used as the counter electrode.

Figure 1:
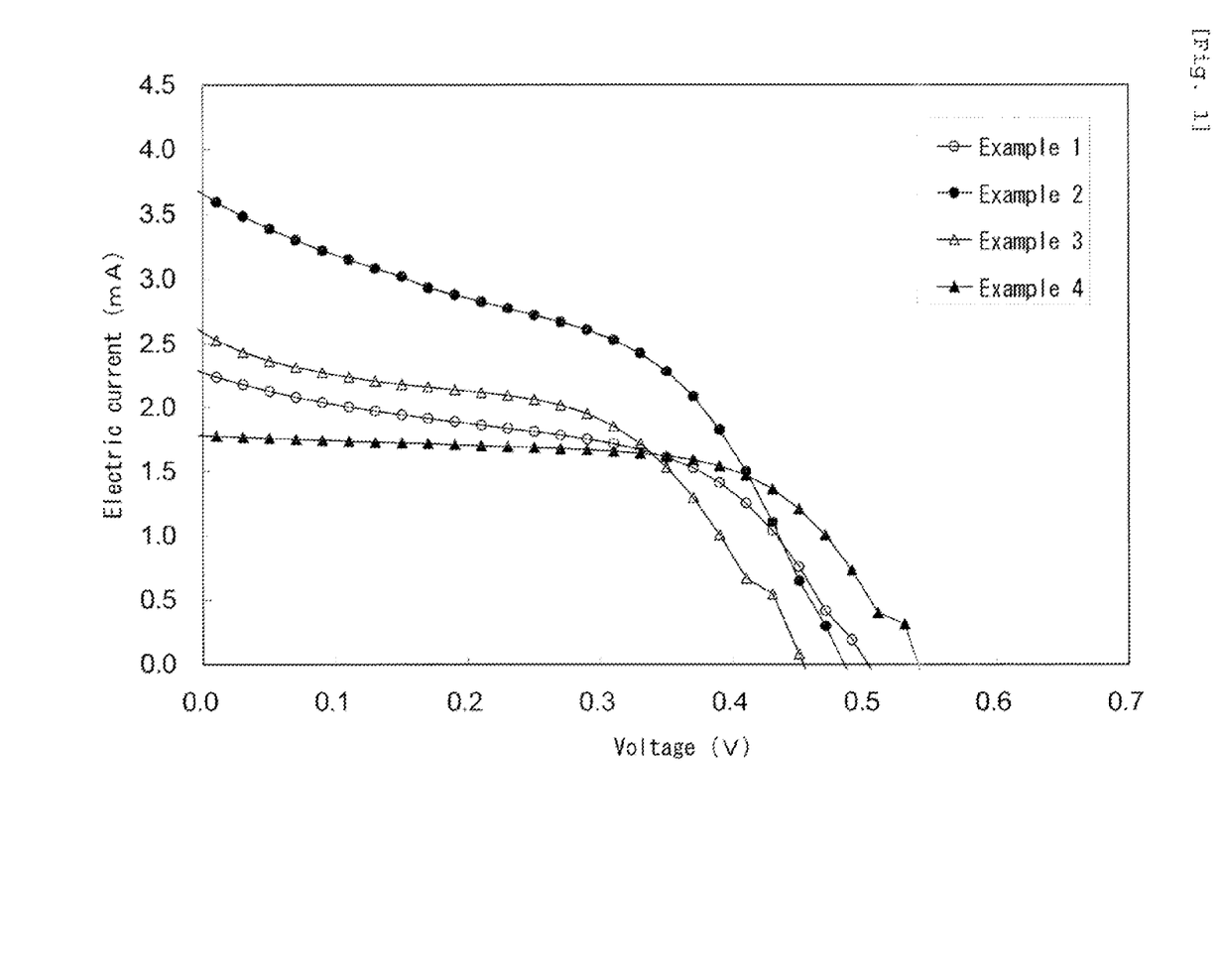
FIG. 1 shows output characteristics of dye-sensitized solar cells obtained in Examples.
Figure 2:
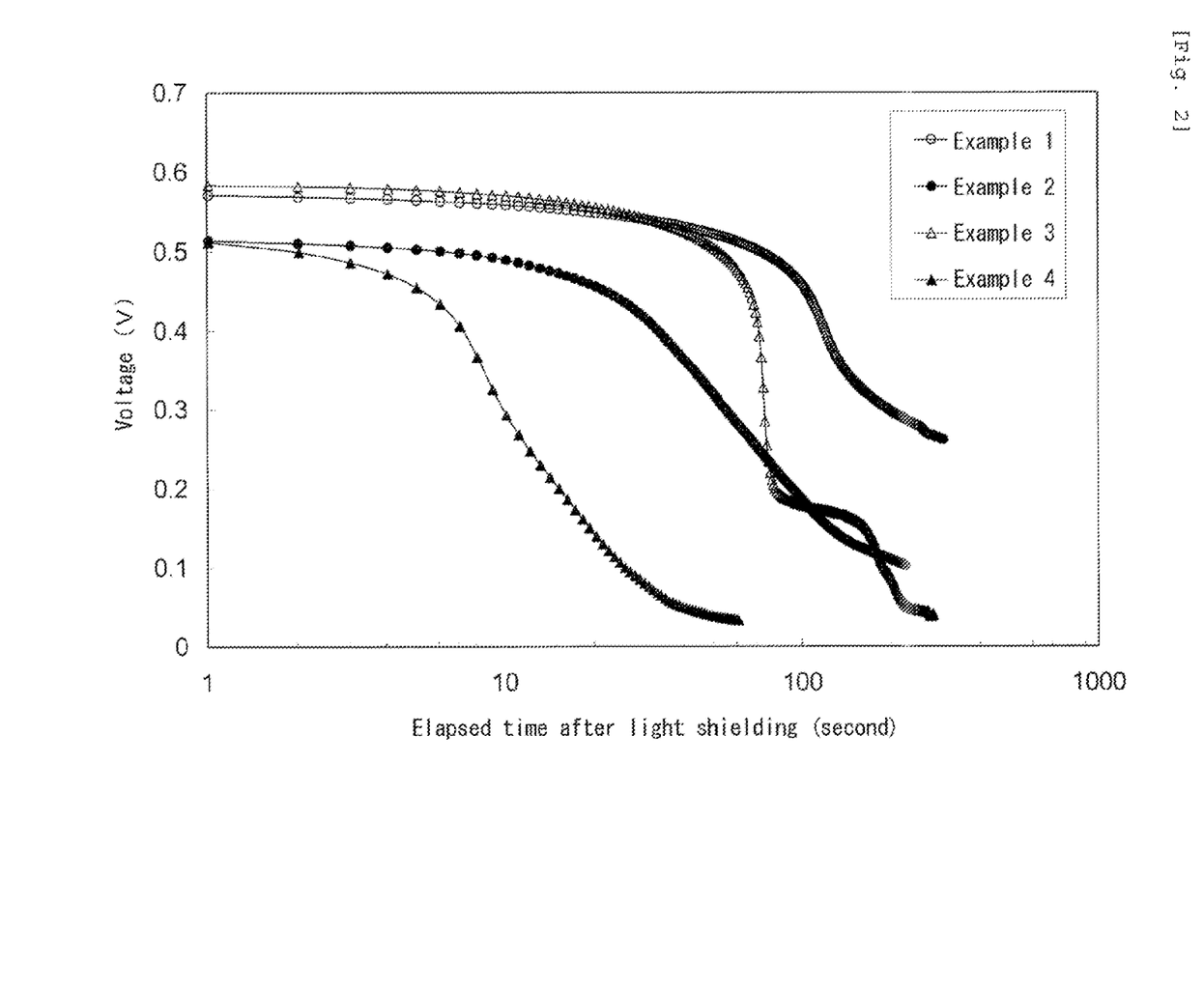
FIG. 2 shows changes of open-circuit voltage after light shielding of dye-sensitized solar cells obtained in Examples.

For each dye-sensitized solar cell obtained in Examples, the output characteristics are shown in FIG. 1, and the changes of open-circuit voltage after light shielding are shown in FIG. 2. The light shielding was carried out by putting out the lamp of the solar simulator. As apparent from these figures, the dye-sensitized solar cells obtained in Examples had both photoelectric conversion characteristic and electricity storage function. Among them, it was found that the dye-sensitized solar cells (Examples 1 to 3), each provided with the electrode having a porous layer as the counter electrode, had a high electricity storage function.

INDUSTRIAL APPLICABILITY

The composition of the present invention, is useful for forming a photoelectric conversion layer or a photoelectric conversion element. In particular, the present invention allows the formation of a photoelectric conversion layer having not only a photoelectric conversion characteristic but also an electricity storage function. In addition, since such a photoelectric conversion layer can be formed without sintering, the photoelectric conversion layer can be formed on a plastic substrate or others. A photoelectric conversion element obtained from such a composition is preferably used as a photoelectric cell, such as a solar cell (in particular, a dye-sensitized solar cell).

The invention claimed is:

1. A photoelectric conversion element comprising:
   i) an electrode comprising a laminate comprising a conductive substrate and a photoelectric conversion layer, the photoelectric conversion layer being formed with a photoelectrically convertible composition,
   ii) an electrolyte layer, and
   iii) a counter electrode having a porous layer, the electrolyte layer being sealed between the electrode and the counter electrode,
   wherein the photoelectrically convertible composition comprises at least a semiconductor and an ionic polymer, the ionic polymer comprising an anionic polymer having a sulfo group,
   wherein the photoelectric conversion layer has an electricity storage function and further contains a dye,
   wherein the photoelectrically convertible composition contains the anionic polymer and the semiconductor at a ratio of 0.05 to 100 parts by weight of the anionic polymer relative to 1 part by weight of the semiconductor.

2. The photoelectric conversion element according to claim 1, wherein the semiconductor comprises a metal oxide.

3. The photoelectric conversion element according to claim 1, wherein the semiconductor comprises a titanium oxide nanoparticle.

4. The photoelectric conversion element according to claim 1, wherein the anionic polymer comprises a strongly acidic ion exchange resin.

5. The photoelectric conversion element according to claim 1, wherein the anionic polymer has a pH value of less than 7 at 25° C.

6. The photoelectric conversion element according to claim 1, wherein the ratio of the anionic polymer is 0.1 to 10 parts by weight relative to 1 part by weight of the semiconductor.

7. The photoelectric conversion element according to claim 1, wherein the semiconductor comprises a titanium oxide nanoparticle, the anionic polymer contains a fluorine-containing resin with the sulfo group and has a pH value of not more than 3, and the ratio of the anionic polymer is 0.2 to 1 part by weight relative to 1 part by weight of the semiconductor.

8. The photoelectric conversion element according to claim 1, wherein the dye comprises a ruthenium complex dye.

9. The photoelectric conversion element according to claim 1, wherein the conductive substrate comprises a plastic substrate having an electric conductor layer.

10. The photoelectric conversion element according to claim 1, wherein the photoelectric conversion layer has a thickness of 0.1 to 100 μm.

11. A process for producing a photoelectric conversion element recited in claim 1, the process comprising:
    coating the conductive substrate with the photoelectrically convertible composition recited in claim 1 to form the photoelectric conversion layer without sintering the semiconductor,
    assembling i) the laminate, as the electrode, comprising the conductive substrate and the photoelectric conversion layer, ii) the electrolyte layer, and iii) the counter electrode having the porous layer,
    and sealing the electrolyte layer between the electrode and the counter electrode,
    wherein the photoelectrically convertible composition comprises at least the semiconductor, and the ionic polymer, the ionic polymer comprising the anionic polymer having the sulfo group,
    wherein the photoelectric conversion layer has the electricity storage function and further contains the dye,
    wherein the photoelectrically convertible composition contains the anionic polymer and the semiconductor at a ratio of 0.05 to 100 parts by weight of the anionic polymer relative to 1 part by weight of the semiconductor.

12. The photoelectric conversion element according to claim 1, which is a dye-sensitized solar cell.

13. A method for imparting the electricity storage function to the photoelectric conversion element of claim 1
    the method comprising:
    mixing the anionic polymer with the semiconductor at a ratio of 0.05 to 100 parts by weight of the anionic polymer relative to 1 part by weight of the semiconductor to form the photoelectrically convertible composition, wherein the anionic polymer has a sulfo group, and
    coating the conductive substrate with the photoelectrically convertible composition to form the photoelectric conversion layer having the electricity storage function without sintering the semiconductor.

* * * * *